US007263233B2

(12) United States Patent
He

(10) Patent No.: US 7,263,233 B2
(45) Date of Patent: Aug. 28, 2007

(54) APPARATUS AND METHOD FOR DATA COMPRESSIBILITY TEST

(75) Inventor: Chun-Xiang He, Calgary (CA)

(73) Assignee: Intel Corporation, Santa Clara ( * ) Notice: Subject to any disclaimer, the term of this patent is extended or adjusted under 35 U.S.C. 154(b) by 840 days.

(21) Appl. No.: 10/328,167

(22) Filed: Dec. 26, 2002

(65) Prior Publication Data

US 2004/0126026 A1   Jul. 1, 2004

(51) Int. Cl.
  *G06K 9/36* (2006.01)
  *H03M 7/34* (2006.01)
(52) U.S. Cl. ............. 382/239; 382/232; 341/51
(58) Field of Classification Search ............ 382/232, 382/233, 238; 341/51; 358/1.15, 426.01; 375/240
  See application file for complete search history.

(56) References Cited

U.S. PATENT DOCUMENTS 5,177,480 A * 1/1993 Clark .................. 341/51
5,648,773 A * 7/1997 Guy .................... 341/51
6,289,130 B1 * 9/2001 Cooklev ............... 382/232

OTHER PUBLICATIONS

The International Telegraph and Telephone Consultative Committee, Data Communication Over the Telephone Network V.42 bls, Geneva 1990.

* cited by examiner

*Primary Examiner*—Duy M. Dang
(74) *Attorney, Agent, or Firm*—Pearl Cohen Zedek Latzer, LLP

(57) ABSTRACT

An encoder may have a compressed mode in which a stream of input characters may be encoded into code words. The encoder may have a transparent mode in which the output stream is substantially identical to the input stream. The encoder may switch from one mode to the other based at least in part upon a data compressibility test. The test may comprise comparing an N-segment sliding average of the number of bits required by the encoder in compressed mode to represent a segment of a fixed number of characters to the number of bits required by the encoder in transparent mode to represent the segment.

14 Claims, 5 Drawing Sheets

APPARATUS AND METHOD FOR DATA COMPRESSIBILITY TEST

BACKGROUND OF THE INVENTION

The International Consultative Committee on Telephony and Telegraphy (CCITT, now International Telecommunication Union—Telecommunication (ITU-T)) V.42bis standard, published as Recommendation V.42 bis in Geneva in 1990, is an addition to the V.42 error-correction protocol for modems. The purpose of the addition is to increase data throughput using a data compression procedure. As defined in the standard, the compressed operation has two modes: a "compressed mode" in which data is transmitted in code words, and a "transparent mode" in which data is transmitted in uncompressed form.

According to the standard, an encoder compatible with the V.42bis standard will switch between these modes on the basis of "data compressibility testing, in which the efficiency of the encoding process is estimated and transparent mode or compressed mode selected to maximize efficiency" (section 7.1f) of Recommendation V.42bis). The standard then states: "The data compression function shall periodically apply a test to determine the compressibility of the data. The nature of the test is not specified in this Recommendation; however it would consist of a comparison of the number of bits required to represent a segment of the data stream before and after compression." (section 7.8 of Recommendation V.42bis).

An encoder compatible with V.42bis would therefore require an implementation of the data compressibility test.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
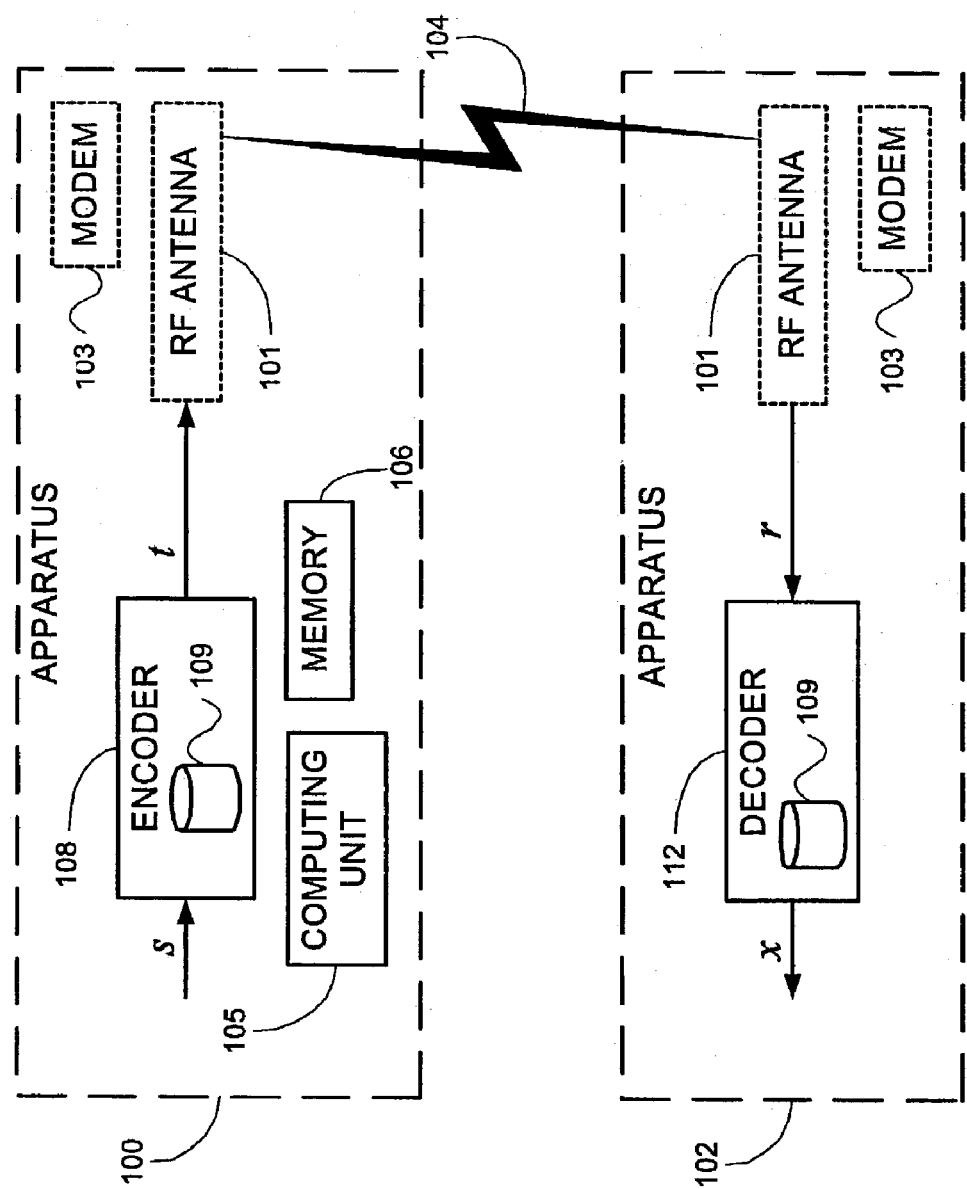
FIG. 1 is a simplified block-diagram illustration of an exemplary system, in accordance with some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

FIG. 1 is a simplified block-diagram illustration of an exemplary system, in accordance with some embodiments of the present invention. An apparatus 100 is able to communicate with an apparatus 102 over a communication channel 104.

Although the scope of the present invention is not limited in this respect, apparatuses 100, 102 may comprise wire or wireless or cable modems of computers (shown as modem 103) and communication channel 104 may be a wide-area-network (WAN) or local-area-network (LAN) or global network such as, for example, the Internet. Alternatively, although the scope of the present invention is not limited in this respect, the system shown in FIG. 1 may be part of a cellular communication system, with one of apparatuses 100, 102 being a base station and the other a mobile station or with both apparatuses 100, 102 being mobile stations, a pager communication system, a personal digital assistant and a server, etc. In such cases, apparatuses 100 and 102 may each comprise a radio frequency antenna 101. In particular, the system shown in FIG. 1 may utilize wireless protocol stacks and the like. Although the scope of the present invention is not limited in this respect, the system shown in FIG. 1 may comprise a Time Domain Multiple Access (TDMA) cellular system or a Global System for Mobile Communications (GSM) cellular system or the like.

Apparatus 100 may comprise an encoder 108. Encoder 108 may receive an input stream s of characters and may produce from them an output stream t. Encoder 108 may be able to operate in a compressed mode, in which encoder 108 encodes input characters into code words using a dictionary 109. Encoder 108 may also be able to operate in a transparent mode, in which output stream t is substantially identical to input stream s.

Apparatus 100 may modulate one or more carrier signals with output stream t, and may transmit the modulated signals (via radio frequency antenna 101, in some cases) through channel 104.

Apparatus 102 may comprise a decoder 112. Apparatus 102 may receive a signal from channel 104 (via radio frequency antenna 101, in some cases), which when demodulated, is signal r. Decoder 112 may receive signal r and may produce from it a signal x. Error-correction techniques may be used to identify and correct errors in data stream x in order for apparatus 102 to retrieve the information s. When encoder 108 is operating in compressed mode, decoder 112 may be able to operate in compressed mode and to decode code words into characters using dictionary 109. When encoder 108 is operating in transparent mode, decoder 112 may be able to operate in transparent mode, in which output data stream x is substantially identical to signal r.

Although the scope of the present invention is not limited in this respect, encoder 108 and decoder 112 may be implemented in software, hardware, firmware or any combination thereof.

When changing from compressed mode to transparent mode, encoder 108 may send an appropriate control code word to decoder 112, therefore some overhead may be involved in making this transition. When changing from transparent mode to compressed mode, encoder 108 may send an appropriate command code to decoder 112, therefore some overhead may be involved in making this transition. It will be appreciated by persons of ordinary skill in the art that in transparent mode, encoder 108 may insert into output stream t one or more escape characters before input characters that match command codes, thus increasing the number of bits required to represent a particular segment of the input data stream comprising these symbols.

Encoder 108 may determine when to make a transition between compressed mode and transparent mode based on a data compressibility test. Some embodiments of the present invention are directed to methods involving a data compressibility test. Some embodiments of the present invention are directed to an apparatus comprising an encoder that is able to perform these methods.

Apparatus 100 may comprise a computing unit 105 and a memory 106. Although the scope of the present invention is not limited in this respect, encoder 108 may be implemented, at least in part, by having computing unit 106 execute instructions related to these methods, the instructions being stored in memory 106.

As will be apparent to those of ordinary skill in the art, in some embodiments, apparatus 100 may comprise modem 103, and modem 103 may comprise encoder 108.

Figure 2:
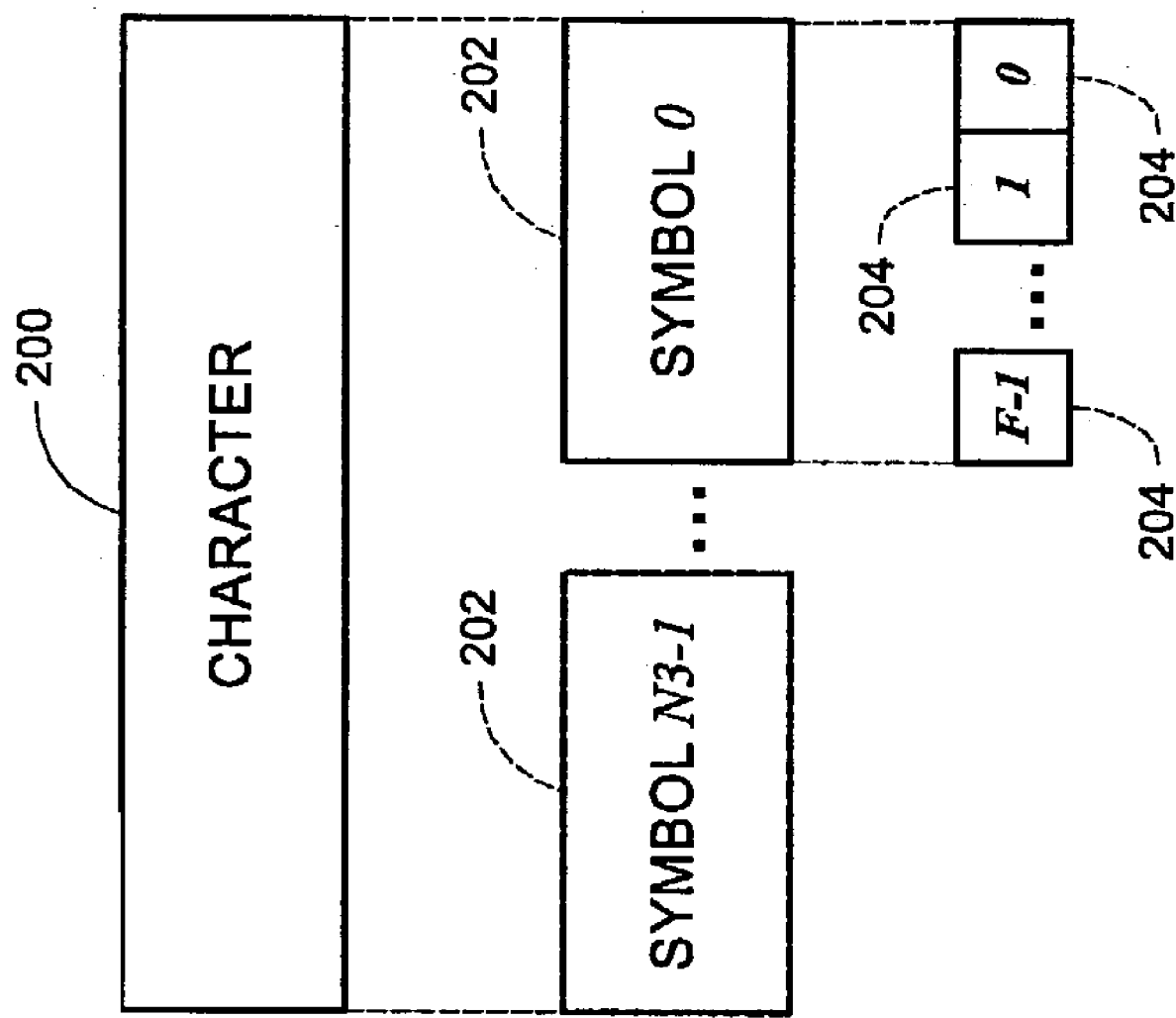
FIG. 2 is a simplified illustration of a character, symbols and bits, helpful in understanding some embodiments of the present invention.

As illustrated in FIG. 2, a character 200 may comprise N3 symbols 202, and each symbol may comprise F bits 204. Although the scope of the present invention is not limited in this respect, N3 maybe 8 and F maybe 1.

Figure 3:
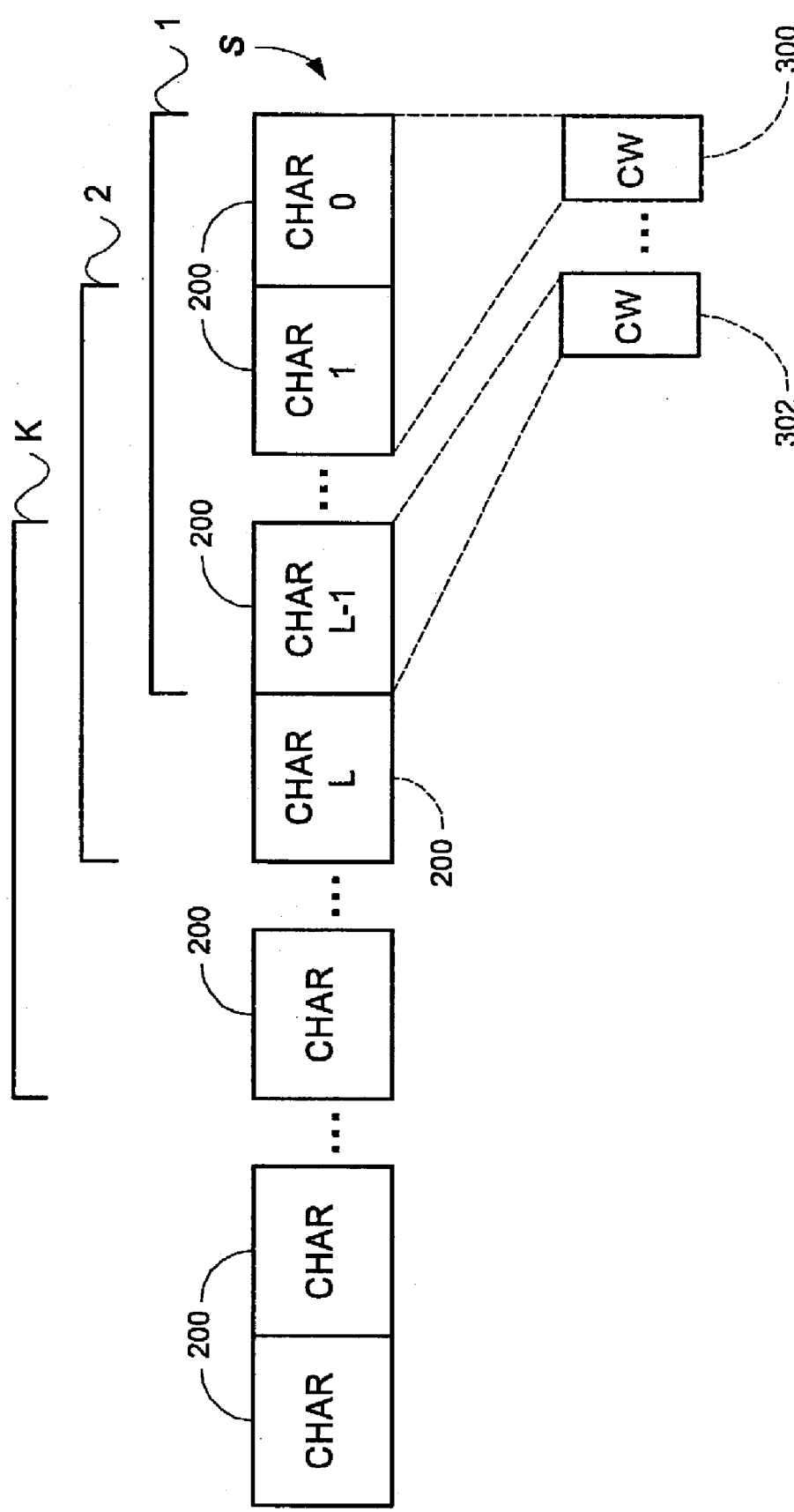
FIG. 3 is a simplified illustration of an exemplary input stream of characters, helpful in understanding some embodiments of the present invention.

FIG. 3 is a simplified illustration of an exemplary input stream of characters, helpful in understanding some embodiments of the present invention. An exemplary input stream s may comprise characters 200. Encoder 108 may receive as input segments (referenced 1, 2, ..., K, ...) of L characters 200. Segment 2 may overlap segment 1 by all characters except character 0 and character L, segment 3 may overlap segment 2 by all characters except character 1 and character L+1, etc.

If encoder 108 were to output the L characters 200 of segment K in transparent mode, the number of bits in the output signal would be as follows:

BITS_transparent($K$)=($L$+number of escape characters, if any)×$N3$×$F$

As explained hereinabove, if any of the characters in segment K match command codes, then the output signal in transparent mode must include one or more escape characters preceding the matching character.

If encoder 108 were to output the L characters of segment K in compressed mode, the number of bits in the output signal would be as follows:

BITS_comp($K$)=sum of bits of codewords used to represent the L characters of segment K It will be appreciated by persons of ordinary skill in the art that some of the code words may represent a single one of the characters of segment K, while others of the code words may represent a sequence of characters of segment K. In the example illustrated in FIG. 3, code word 302 may represent character L-1, while code word 300 may represent collectively characters 0 and 1. Therefore, the minimum number of code words whose bits are summed in the calculation of BITS_comp(K) is 1, and the maximum number is L. The actual number of code words will depend upon the characters of segment K and dictionary 109. Moreover, the size (in bits) of the code words in dictionary 109 will affect the value of BITS_comp(K).

Figure 4:
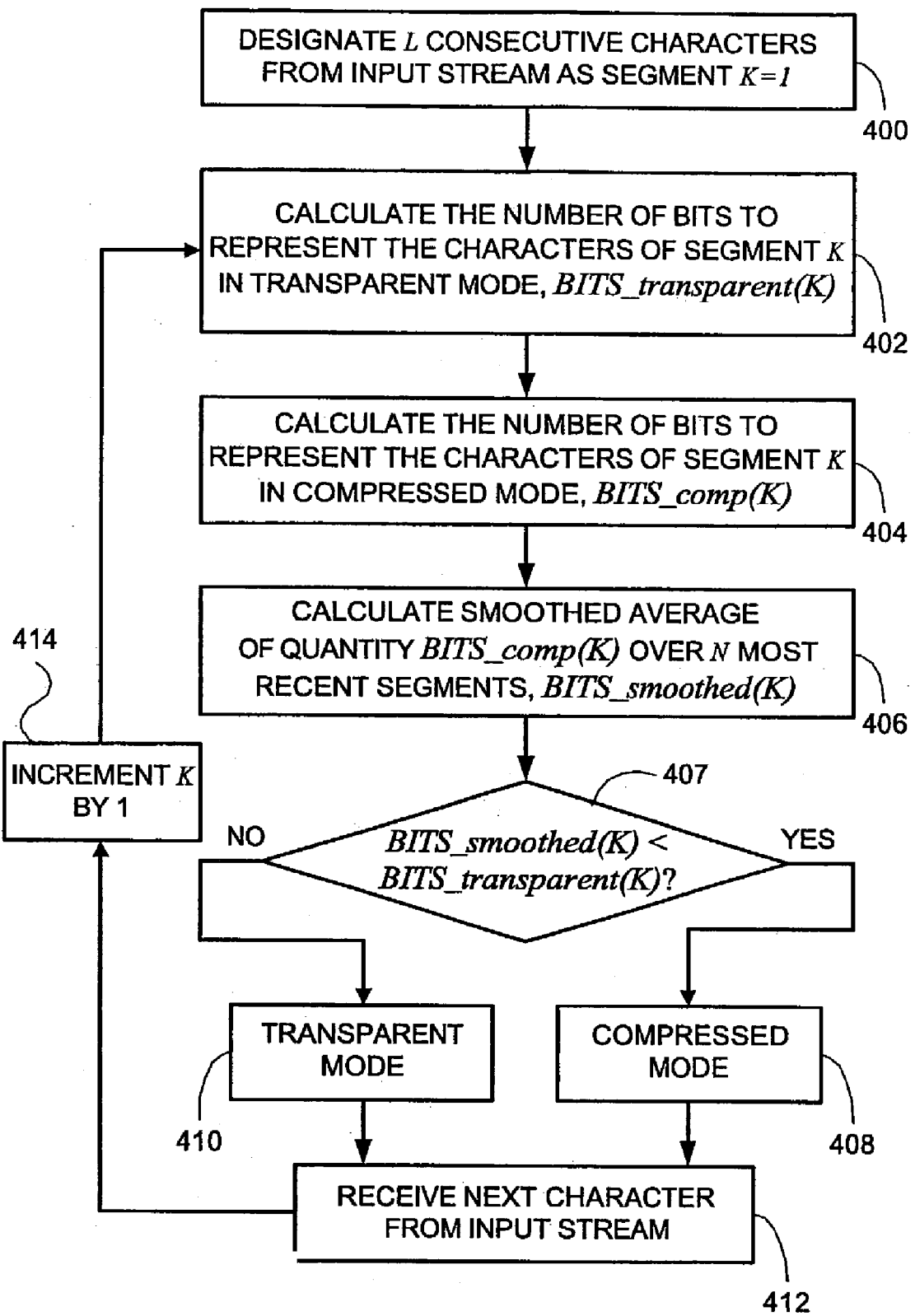
FIG. 4 is a simplified flowchart illustration of a method according to some embodiments of the present invention.

FIG. 4 is a simplified flowchart illustration of a method according to some embodiments of the present invention. Encoder 108 may receive a segment K of L characters 200 from input stream s (400). Encoder 108 may calculate the quantity BITS_transparent(K) for the segment K whose last character is the most recently input character (operation 402). Encoder 108 may also calculate the quantity BITS_comp(K) for the segment K (operation 404). Operations 400 and 402 may be performed in the order shown in FIG. 4, in reverse order, or substantially in parallel.

Encoder 108 may then calculate a smoothed quantity (operation 406), BITS_smoothed(K), as follows:

$$\text{BITS\_smoothed}(K) = \begin{cases} (\text{BITS\_comp}(K) + \ldots + \text{BITS\_comp}(K-N-1))/N, & \text{if } K \geq N \\ (\text{BITS\_comp}(K) + \ldots \text{BITS\_comp}(1))/K, & \text{if } K < N \end{cases}$$

where N is the number of data segments over which the averaging is done. In other words, if the index K of the most recently received data segment is greater than or equal to N, then BITS_smoothed(K) is the average of BITS_comp for the N most recently received data segments. If fewer than N data segments have been processed by encoder 108, then the averaging may be done over the processed data segments. The smoothed quantity may therefore be considered an N-segment sliding average of the number of bits required in compressed mode to represent a segment of L characters by code words.

Encoder 108 may then compare the smoothed quantity BITS_smoothed(K) to the quantity BITS_transparent(K) to determine whether to operate in compressed mode or transparent mode (operation 407). If BITS_smoothed(K) is less than BITS_transparent(K), then encoder 108 may determine to operate in compressed mode (408). Otherwise, encoder 108 may determine to operate in transparent mode (410). Since, as mentioned hereinabove, transitions between compressed mode and transparent mode may involve overhead, a data compressibility test as illustrated in FIG. 4 may lead to a transition between modes once a trend has been established over a number of segments.

Encoder 108 may then receive the next segment of L characters from input stream s (412). The value of K will be incremented (414) and this most recently received segment will be indexed by K. The method may then continue from operation 402.

Figure 5:
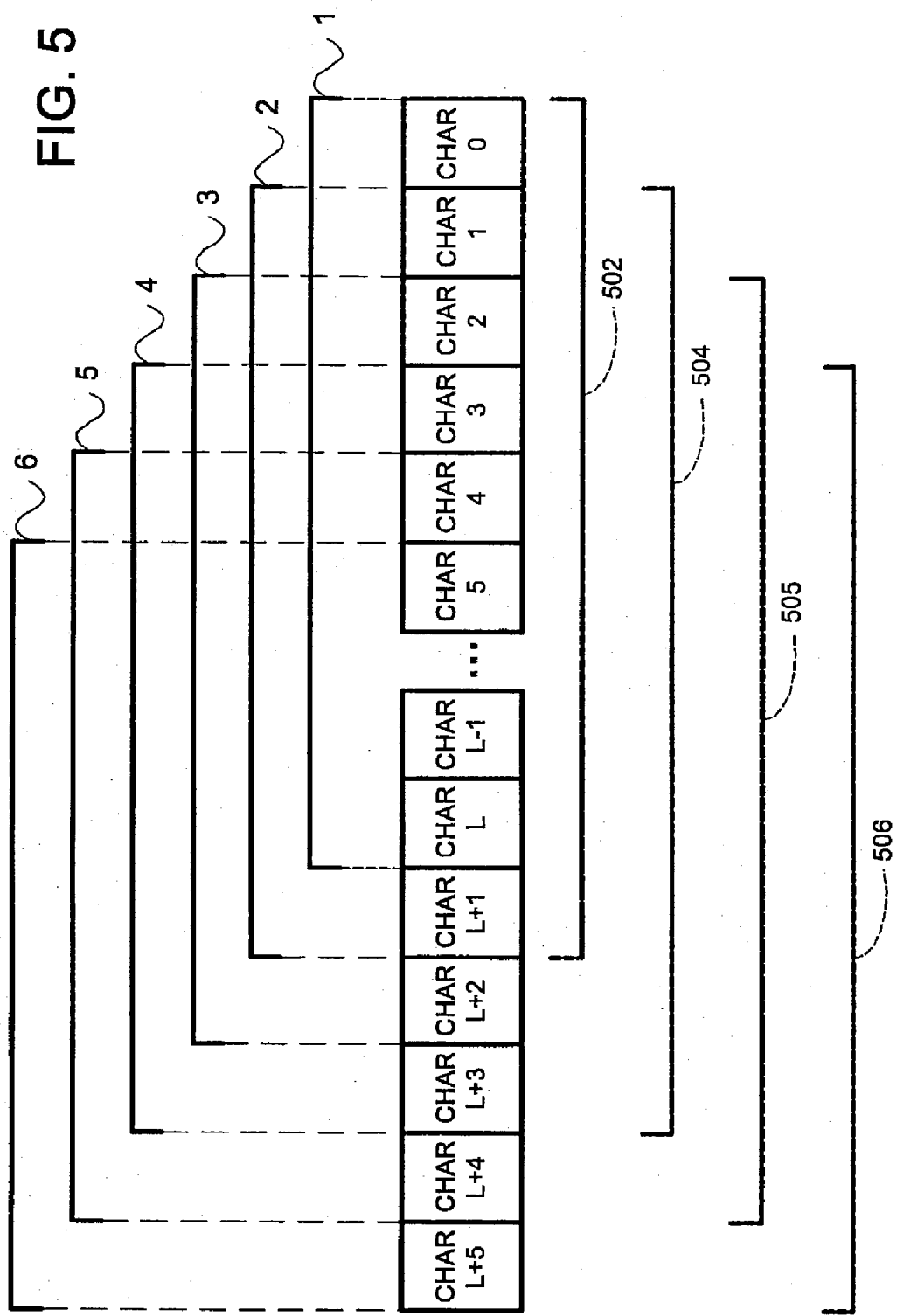
FIG. 5 is a simplified illustration of an exemplary input stream of characters, helpful in understanding some embodiments of the present invention.

FIG. 5 is a simplified illustration of an exemplary input stream of characters, helpful in understanding some embodiments of the present invention. Data segments 1-6 are shown, each comprising L characters. In the example shown, the smoothing is performed by averaging the values of BITS_comp for three consecutive segments. In other words, N has a value of 3. Thus, the smoothed calculation for K=4 involves the characters in a group referenced 504, the smoothed calculation for K=5 involves the characters in a group referenced 505, and the smoothed calculation for K=6 involves the characters in a group referenced 506. However, the smoothed calculation for K=2 involves only the characters in a group referenced 502, which is a smaller group than groups 504, 505 and 506.

Although the scope of the present invention is not limited in this respect, some considerations for choosing the values of L and N include: (a) the overhead of the data compressibility test may affect the throughput rate of the apparatus due to the limitation of the computing resources in the apparatus; (b) the overhead of changing from one mode to the other; (c) N should be big enough to provide a "smoothing" effect; and (d) if N is too big, necessary mode changes may be delayed. In a non-limiting example, L may have the value 256 and N may have the value 64. In the case of a plain text input stream, choosing the values of L and N may be a trade-off between the maximum compression rate and the overhead for the computing resources.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:
   receiving an input stream of characters;
   calculating an average of number of bits used to represent a segment in a compressed mode over consecutive overlapping segments, the segments comprising a fixed number of characters with code words;
   comparing the average of the number of bits to the number of bits used to represent said segment in a transparent mode; and
   outputting an output stream comprising said segment in the compressed mode or the transparent mode based on the comparison.

2. The method of claim 1, further comprising calculating said average over a predetermined number of said consecutive overlapping segments.

3. A method comprising:
   receiving an input stream of characters;
   determining whether to operate in compressed mode or transparent mode by comparing an average of number of bits used to represent a segment in a compressed mode over consecutive overlapping segments, the segments comprising a fixed number of characters with code words to number of bits used to represent said segment in said transparent mode; and
   outputting an output stream comprising said segment in the compressed mode or the transparent mode based on the comparison.

4. The method of claim 3, further comprising calculating said average over a predetermined number of said consecutive overlapping segments.

5. An article comprising a computer readable storage medium having stored thereon instructions that, when executed by a processing platform, result in:
   calculating an average of number of bits used to represent a segment in a compressed mode over consecutive overlapping segments, the segments comprising a fixed number of characters with code words;
   comparing the avenge of the number of bits to number of bits used to represent said segment in a transparent mode; and
   outputting an output stream comprising said segment in the compressed mode or the transparent mode based on the comparison.

6. The article of claim 5, wherein said instructions, when executed, further result in:
   calculating said average over a predetermined number of said consecutive overlapping segments.

7. An apparatus comprising:
   an encoder to receive an input stream of characters, to calculate an average of number of bits used to represent a segment over consecutive overlapping segments, the segments comprising a fixed number of characters with code words and to determine whether to operate in compressed mode or transparent mode by comparing the average to the number of bits used to represent the segment in the transparent mode.

8. The apparatus of claim 7, wherein said encoder is able to calculate the average over a predetermined number of consecutive overlapping segments.

9. The apparatus of claim 7, further comprising a modem to transmit a signal comprising output of said encoder.

10. The apparatus of claim 7, further comprising a radio frequency antenna to transmit a signal comprising output of said encoder.

11. An apparatus comprising:
    a radio frequency antenna; and
    an encoder coupled to said antenna, said encoder is to receive an input stream of characters, to calculate an average of number of bits used to represent a segment over consecutive overlapping segments, the segments comprising a fixed number of characters with code words and to determine whether to operate in compressed mode or transparent mode by comparing the average to the number of bits used to represent the segment in the transparent mode.

12. The apparatus of claim 11, wherein said encoder is able to calculate the average over a predetermined number of consecutive overlapping segments.

13. A system comprising:
    a first apparatus comprising an encoder to receive an input stream of characters, to calculate an average of number of bits used to represent a segment over consecutive overlapping segments, the segments comprising a fixed number of characters with code words and to determine whether to operate in compressed mode or transparent mode by comparing the average to the number of bits used to represent the segment in the transparent mode; and
    a second apparatus comprising a decoder to determine said input stream of characters from a signal comprising output of said encoder.

14. The system of claim 13, wherein said encoder is able to calculate said average over a predetermined number of consecutive overlapping segments of characters.

* * * * *